United States Patent
Chiang et al.

(10) Patent No.: US 8,941,996 B2
(45) Date of Patent: Jan. 27, 2015

(54) CIRCUIT BOARD AND HEAT DISSIPATION DEVICE THEREOF

(75) Inventors: Yu-Feng Chiang, New Taipei (TW); Cheng-Hao Lee, New Taipei (TW); Chun-Lin Wang, New Taipei (TW); Tung-Huang Kuo, New Taipei (TW)

(73) Assignee: Wistron Corporation, New Taipei (TW)

( * ) Notice: Subject to any disclaimer, the term of this patent is extended or adjusted under 35 U.S.C. 154(b) by 279 days.

(21) Appl. No.: 13/611,398

(22) Filed: Sep. 12, 2012

(65) Prior Publication Data
US 2014/0016272 A1 Jan. 16, 2014

(30) Foreign Application Priority Data
Jul. 13, 2012 (TW) .............................. 101125345 A

(51) Int. Cl.
*H05K 7/20* (2006.01)
*H01L 23/40* (2006.01)

(52) U.S. Cl.
USPC ........... 361/719; 361/704; 361/709; 361/710; 257/706; 257/718; 257/719; 165/185

(58) Field of Classification Search
USPC ................. 361/704, 709–710, 719; 165/185; 257/706, 713, 718–719
See application file for complete search history.

(56) References Cited

U.S. PATENT DOCUMENTS

| | | | | |
|---|---|---|---|---|
| 7,268,425 | B2 * | 9/2007 | Mallik et al. | 257/706 |
| 7,327,577 | B2 * | 2/2008 | Gilliland et al. | 361/719 |
| 7,456,047 | B2 * | 11/2008 | Mallik et al. | 438/108 |
| 7,564,690 | B2 * | 7/2009 | Gilliland et al. | 361/719 |
| 7,573,709 | B2 * | 8/2009 | Gilliland et al. | 361/679.54 |
| 7,656,668 | B2 | 2/2010 | Lin | |
| 7,924,568 | B2 * | 4/2011 | Ho et al. | 361/710 |
| 8,526,185 | B2 * | 9/2013 | Heidepriem et al. | 361/712 |
| 2006/0203453 | A1 * | 9/2006 | Chen | 361/704 |
| 2011/0182035 | A1 * | 7/2011 | Yajima | 361/717 |

FOREIGN PATENT DOCUMENTS

| | | | |
|---|---|---|---|
| TW | M407597 U | 7/2011 | |
| TW | M410447 U | 8/2011 | |
| WO | WO 2006070121 A1 * | 7/2006 | ............. H01L 23/34 |

* cited by examiner

*Primary Examiner* — Robert J Hoffberg
(74) *Attorney, Agent, or Firm* — Muncy, Geissler, Olds & Lowe, P.C.

(57) ABSTRACT

A heat dissipation device is used in a circuit board, where the circuit board includes a chip and at least one positioning hole disposed around the chip, and each of the positioning holes has a bare metal area on its periphery. The heat dissipation device includes a heat dissipation element, a conductive element and at least one fixing part. The heat dissipation element is disposed on the chip; the conductive element is connected electrically to the bare metal area of the circuit board and the heat dissipation element respectively; the fixing part passes through the fixing holes and is connected to the positioning hole, so as to fix the heat dissipation element to the circuit board. A circuit board is also provided, which includes a substrate, a chip, a positioning hole and the heat dissipation device.

12 Claims, 9 Drawing Sheets

US 8,941,996 B2

CIRCUIT BOARD AND HEAT DISSIPATION DEVICE THEREOF

CROSS-REFERENCES TO RELATED APPLICATIONS

This non-provisional application claims priority under 35 U.S.C. §119(a) on patent application No. 101125345 filed in Taiwan, R.O.C. on Jul. 13, 2012, the entire contents of which are hereby incorporated by reference.

BACKGROUND OF THE INVENTION

1. Technical Field

The present invention relates to a circuit board and a heat dissipation device thereof.

2. Related Art

With the continuous development of technologies, the present consumer electronic products have a more and more intensive process due to an increasingly growing working clock of processing chips (CPU/Scalar). Processing chip power is becoming increasingly higher; accordingly, heat generated by the processing chips may be accumulated, resulting in internal elements being damaged, or working efficiency being reduced. In the prior art, heat dissipation devices are additionally disposed on processing chips, and the heat accumulation problem of the processing chips is resolved using the heat dissipation devices.

However, during operation a chip generates signals unexpected by a system or even signals adversely affecting the operation, and an adjacent heat dissipation device receives a high-frequency noise generated by the chip. However, because of the disposition of the heat dissipation device, especially a heat dissipation fin, which is not conductively connected to a circuit board where the chip is located, the high-frequency noise generated by the chip is coupled to the heat dissipation fin and has no path for elimination. Consequently, in a wireless transmission manner, the high-frequency noise radiates out by using the heat dissipation fin as an antenna. As a result, adjacent electronic elements are subject to interference of the high-frequency noise, resulting in that the system is unstable or has unexpected problems.

Therefore, high heat-accumulation caused due to the high-clock operation of the processing chips may be resolved by disposing the heat dissipation devices. However, after the heat dissipation devices are disposed, the high-frequency nose generated due to the high-clock operation of the chips is radiated to a surrounding environment by using the heat dissipation devices as antennas, and an electromagnetic interference problem arises spontaneously.

In conclusion, the circuit boards and the heat dissipation devices thereof in the prior art have an electromagnetic interference problem resulting from that high-frequency noise generated during a high-speed operation of chips, radiates out through heat dissipation elements.

SUMMARY

Accordingly, the present invention provides a heat dissipation device, used in a circuit board, where the circuit board includes a chip and at least one positioning hole disposed around the chip, and each of the positioning holes has a bare metal area on its periphery. The heat dissipation device includes a heat dissipation element, a conductive element and at least one fixing part. The heat dissipation element is disposed on the chip and has at least one fixing hole. The conductive element is connected electrically to the bare metal area of the circuit board and the heat dissipation element respectively. The fixing part passes through each of the fixing holes and is connected to each of the positioning holes, so as to fix the heat dissipation element to the circuit board.

The present invention further provides a circuit board, including a substrate, a chip, a heat dissipation element, at least one fixing part, and a conductive element. The substrate has at least one positioning hole, and each of the positioning holes has a bare metal area on its periphery. The chip is disposed on the substrate and located between the positioning holes. The heat dissipation element is disposed on the chip and has at least one fixing hole. The fixing part passes through the fixing hole and is connected to the positioning hole, so as to fix the heat dissipation element to the substrate. The conductive element is connected electrically to the bare metal area and the heat dissipation element respectively.

One of the characteristics of the present invention lies in that, a conductive element is additionally added to a heat dissipation device in the prior art, and the conductive element of the heat dissipation device is enabled to be connected electrically to a heat dissipation element and a bare metal area, so that the heat dissipation element is grounded, thereby resolving the electromagnetic interference problem resulting from that a high-frequency noise generated during the computation of a chip radiates out by using the heat dissipation element as an antenna.

The detailed features and advantages of the present invention are described below in great detail through the following embodiments, the content of the detailed description is sufficient for persons skilled in the art to understand the technical content of the present invention and to implement the present invention there accordingly. Based upon the content of the specification, the claims, and the drawings, any persons skilled in the art can easily understand the relevant objectives and advantages of the present invention.

BRIEF DESCRIPTION OF THE DRAWINGS

The disclosure will become more fully understood from the detailed description given herein below for illustration only, and thus not limitative of the present invention, wherein.

DETAILED DESCRIPTION

Figure 1A:
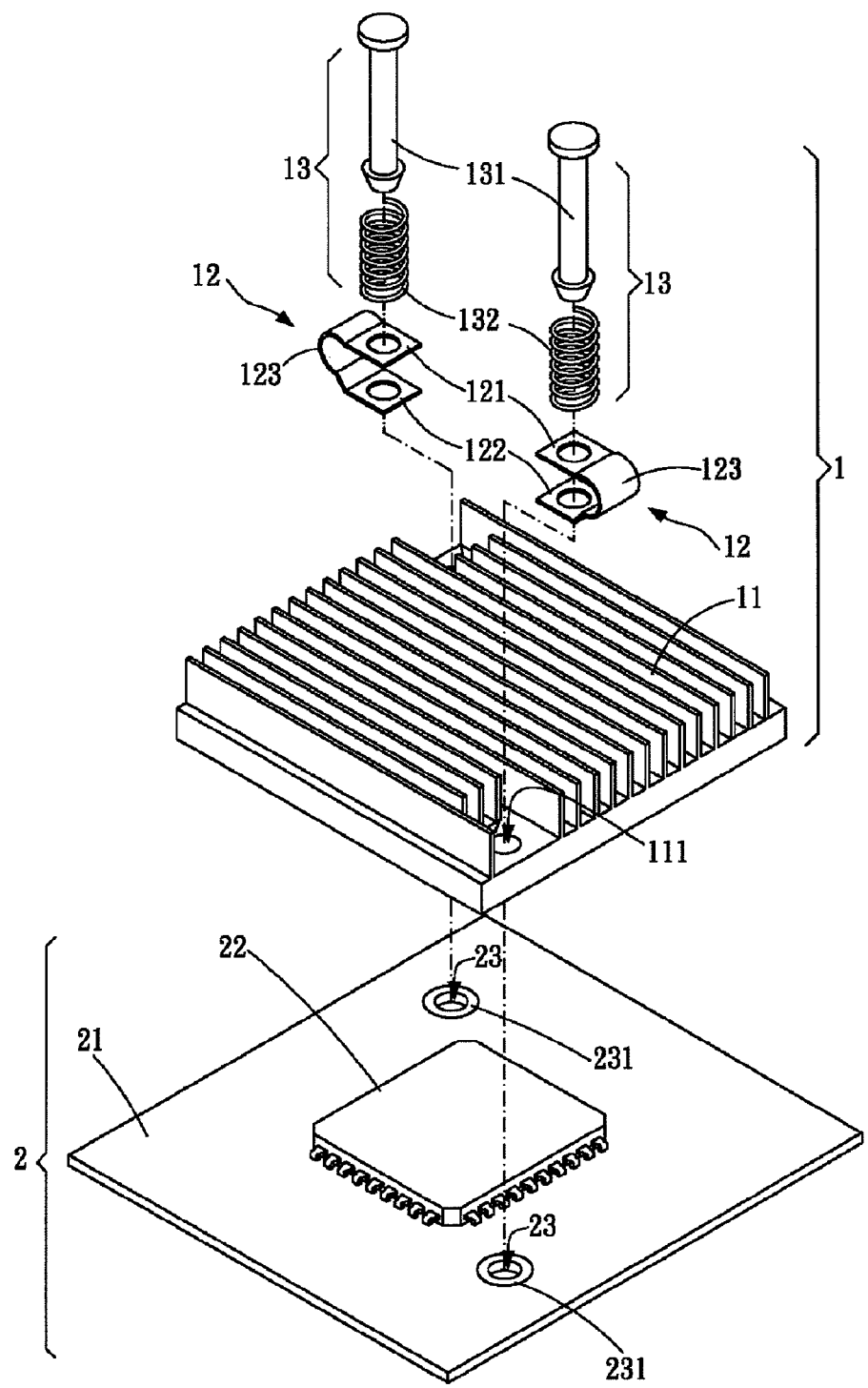
FIG. 1A is an explosive view of a first embodiment of the present invention.
Figure 1B:
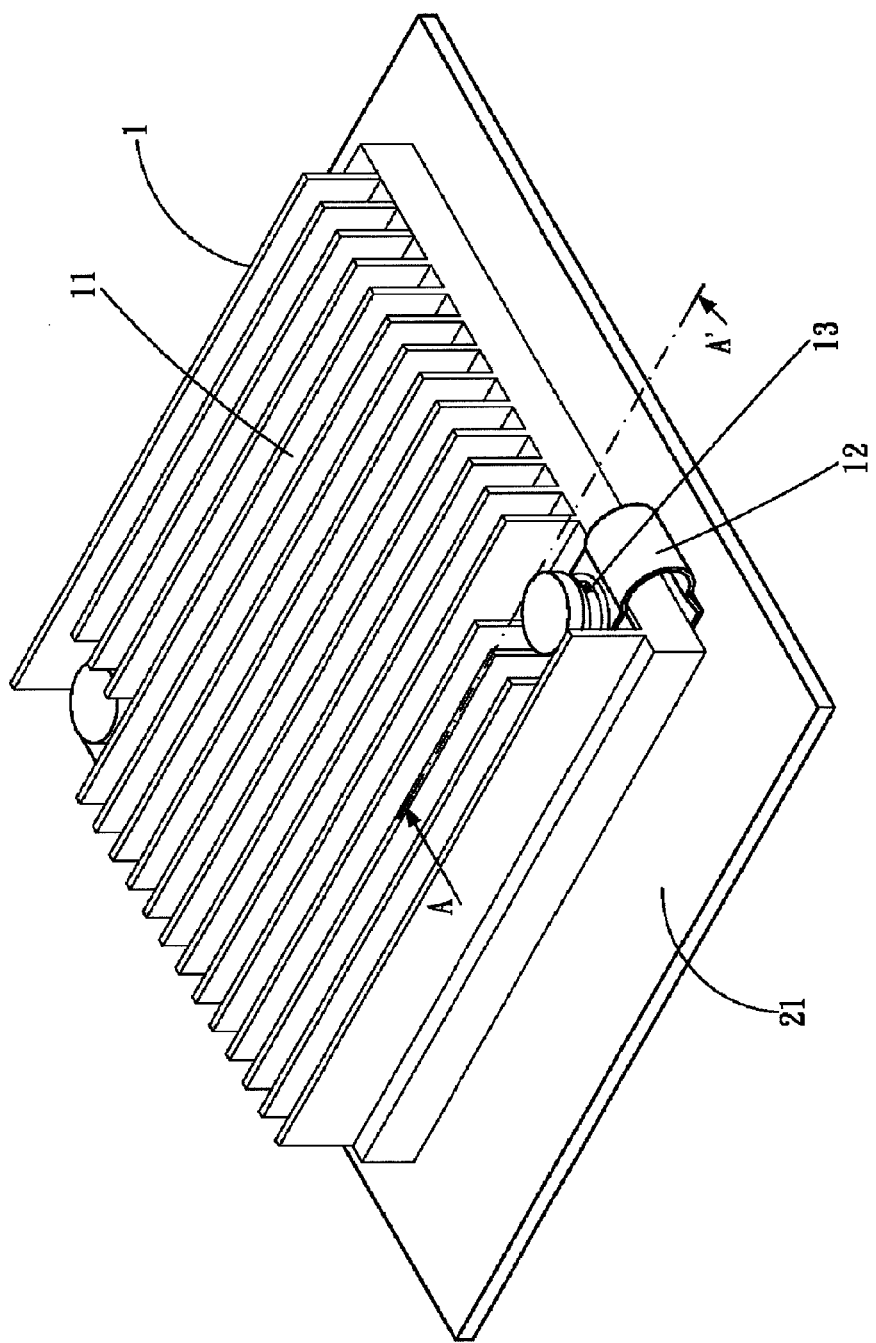
FIG. 1B is an assembly view of the first embodiment of the present invention.
Figure 1C:
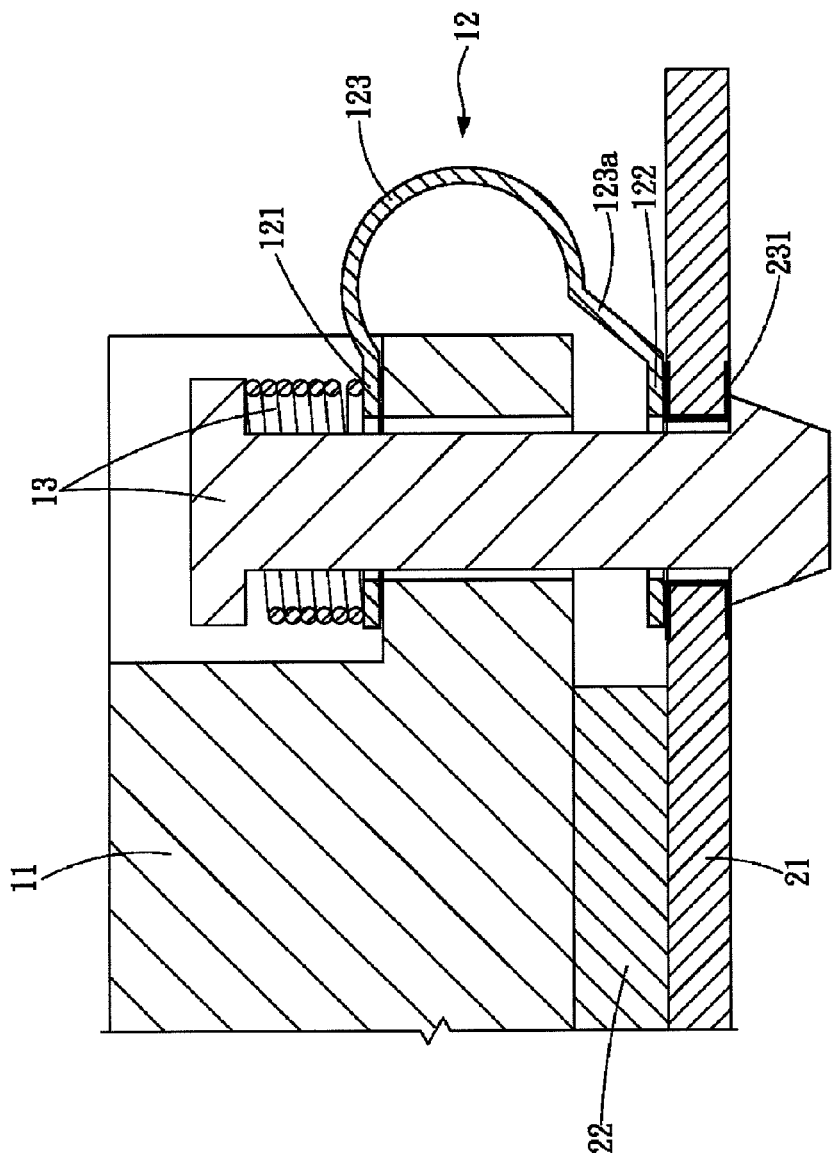
FIG. 1C is a sectional view along a section line AA' of FIG. 1B.

FIGS. 1A to 1C are respectively an explosive view of a first embodiment of the present invention, an assembly view of the first embodiment of the present invention, and a sectional view along a section line AA' of FIG. 1B. Please refer to FIGS. 1A to 1C, in which a heat dissipation device 1 is provided, used in a circuit board 2. The circuit board 2 includes a substrate 21, a chip 22, and at least one positioning hole 23. Each of the positioning holes 23 is disposed around the chip 22, and each of the positioning holes 23 has a bare metal area 231 on its periphery. The heat dissipation device 1 includes a heat dissipation element 11, a conductive element 12 and at least one fixing part 13.

The heat dissipation element 11 is disposed on the chip 22, and contacts with the chip 22 face to face to receive heat generated during high-speed computation of the chip 22. The heat dissipation element 11 has multiple heat dissipation fins on the other surface with respect to a contact surface, so as to increase a heat dissipation area of the heat dissipation element. Additionally, in an embodiment, a heat pipe (not shown), passes through the heat dissipation element 11, and a fan (not shown), is disposed above the heat dissipation fins, to further enhance a heat dissipation effect.

The conductive element 12 is connected electrically to the bare metal area 231 of the circuit board 2 and the heat dissipation element 11 respectively, and the heat dissipation element 11 is connected electrically to the bare metal area 231 through the conductive element 12. The bare metal area 231 may be a copper bare area on the circuit board 2. On a circuit layout of the circuit board 2, a potential of the bare copper area is generally 0. Therefore, when the heat dissipation element 11 is connected electrically to the circuit board 2 through the conductive element 12, equivalently, the conductive element 12 is grounded. As a result, when a high-frequency noise generated during computation of the chip 22 is coupled to the heat dissipation element 11, the high-frequency noise may be eliminated as the conductive element 12 is grounded, causing no electromagnetic interference to other electronic components.

Each of the fixing parts 13 respectively passes through each of the positioning holes 23 to fix and position the heat dissipation element 11 to the circuit board 2. A push-pin is a common fixing part 13, whose structure mainly includes a pin main body 131 and a metal spring 132, where the metal spring 132 is sleeved to an outer edge of the pin main body 131.

Figure 2A:
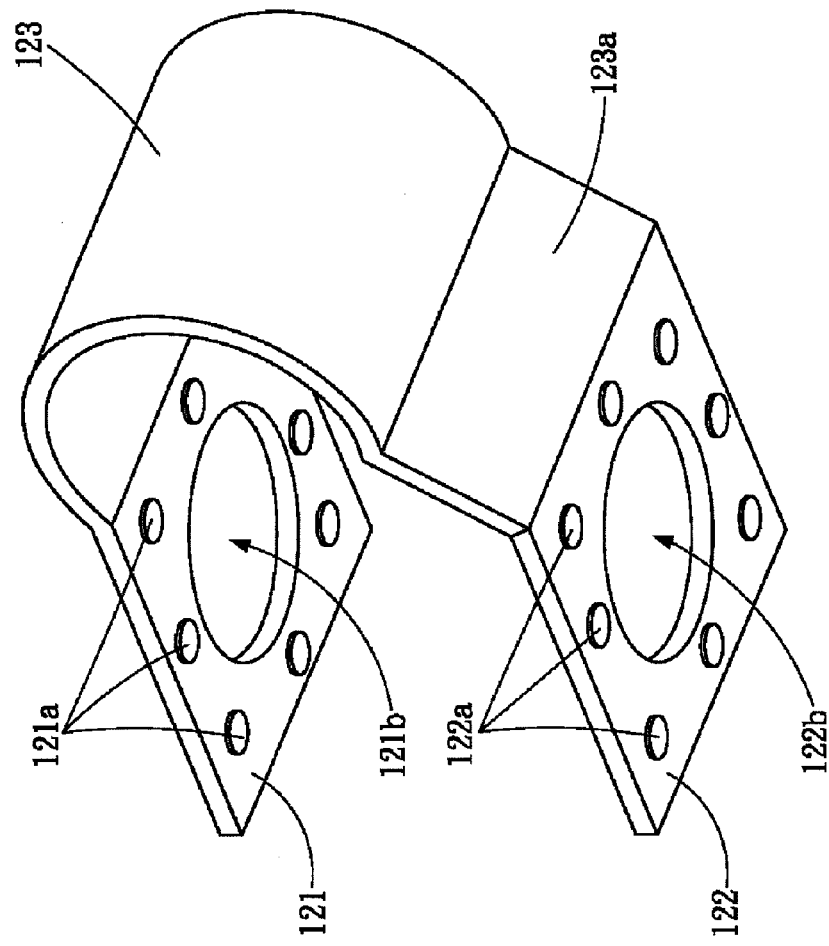
FIG. 2A is a schematic diagram 1 of a conductive element according to the first embodiment of the present invention.

FIG. 2A is a schematic diagram 1 of a conductive element according to a first embodiment of the present invention. Please refer to FIG. 2A, in which a conductive element 12 is provided, where the conductive element 12 includes a first junction 121, a second junction 122 and a bridge portion 123. The first junction 121 is in direct contact with the heat dissipation element 11 to be connected electrically to the heat dissipation element 11. The second junction 122 is in direct contact with the bare metal area 231 on the periphery of the positioning hole 23 to be connected electrically to bare metal area the bare metal area 231. Two ends of the bridge portion 123 are connected electrically to the first junction 121 and the second junction 122 respectively. In addition, the bridge portion 123 has flexibility and provides an elastic force to enable the second junction 122 to press against the bare metal area 231. The heat dissipation element 11 is connected electrically to the bare metal area 231 through the first junction 121, the bridge portion 123 and the second junction 122.

In an embodiment, the first junction 121 has a first through hole 121b and at least one first bulge 121a distributed around the first through hole 121b, where the first junction 121 is connected electrically to the heat dissipation element 11 through the first bulge 121a. Additionally, the second junction 122 has a second through hole 122b and at least one second bulge 122a distributed around the second through hole 122b, where the second junction 122 is connected electrically to the bare metal area 231 through the second bulge 122a. The conductive element 12 is generally made of a metal material, so the first junction 121 and the second junction 122 may be made unparallel during a manufacturing procedure. Moreover, the circuit board 2 may more or less have a warping phenomenon, instead of a uniformly flat surface. Therefore, when the first junction 121 contacts with the heat dissipation element 11, it is possible that, instead of a surface contact, a point contact occurs. Likewise, when the second junction 122 contacts with the bare metal area 231 of the circuit board 2, a similar problem may also occur. According to the electronic principles, when an electrical contact manner between two conductors changes from the surface contact to the point contact, a contact resistance greatly increases, whereas the increasing of the contact resistance reduces a noise elimination effect of the conductive element 12 of the present invention. Therefore, by disposing the first bulge 121a and the second bulge 122a respectively on the first junction 121 and the second junction 122, when the first junction 121 and the second junction 122 are unparallel or a warping phenomenon exists on the surface of the circuit board 2, the greatly increased contact resistance may be effectively alleviate.

Figure 2B:
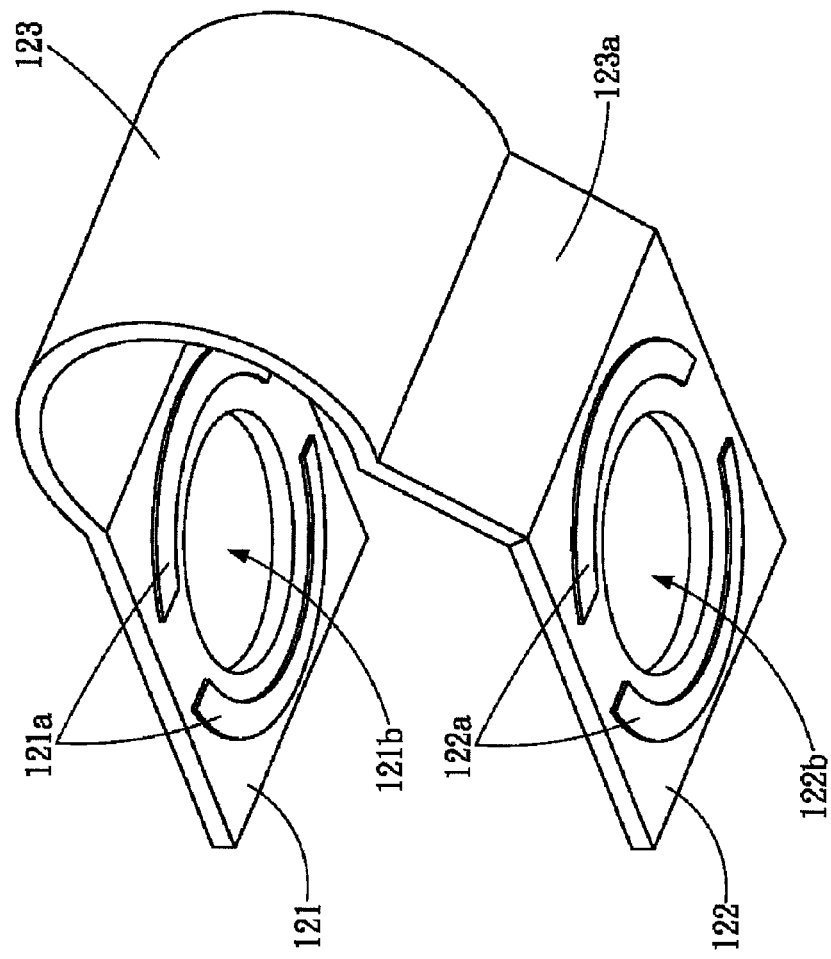
FIG. 2B is a schematic diagram 2 of a conductive element according to the first embodiment of the present invention.

FIG. 2B is a schematic diagram 2 of a conductive element according to a first embodiment of the present invention. Please refer to FIG. 2B, in which in addition to the multiple point-like bulges shown in FIG. 2A, the foregoing first bulge 121a and the second bulge 122a may also be two symmetrical semi-circular bulges shown in FIG. 2B, but the present invention is not limited thereto.

Please refer to FIG. 1A and FIG. 2A, in this embodiment, the heat dissipation element 11 has a fixing hole 111 corresponding to the first through hole 121b and the second through hole 122b. The pin main part 131 of the fixing part 13 passes through the first through hole 121b, the fixing hole 111 and the second through hole 122b in sequence, and then is inserted into the positioning hole 23 of the circuit board 2, to fix the heat dissipation element 11 to the circuit board 2. The metal spring 132 of the fixing part 13 further presses the first junction 121, so that the first junction 121 electrically contacts with a surface of the heat dissipation element 11. Additionally, because a distance from the first junction 121 to the second junction 122 is a slightly larger than a distance from a contact surface of the heat dissipation element 11 and the first junction 121 to the bare metal area 231, the conductive element 12 is in compressed state. Moreover, the flexible bridge portion 123 provides an elastic force for the second junction 122, so that the second junction 122 presses against and electrically contacts with the bare metal area 231 of the circuit board 2.

Please refer to FIG. 2A, in which in another embodiment, the bridge portion 123 is connected to the second junction 122 through an inclined plane 123a. When the second junction 122 presses against the bare metal area 231, an angle is formed between the inclined plane 123a and the circuit board 2 to enable the bridge portion 123 to keep a distance from the circuit board 2, so as to avoid a short circuit resulting from that the conductive element 12 accidentally contacts with other electronic elements or lines on the circuit board 2. The angle may be 45°, 60° or 75°, but the present invention is not limited thereto.

Figure 2C:
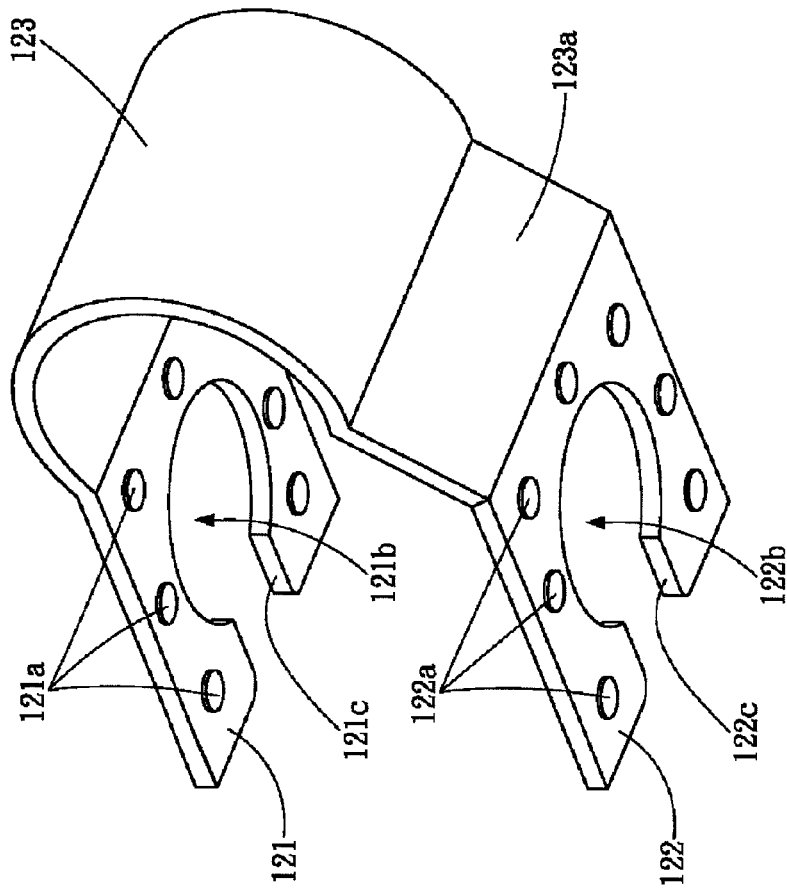
FIG. 2C is a schematic diagram 3 of a conductive element according to the first embodiment of the present invention.

Please refer to FIG. 2C, in which in another embodiment, the first through hole 121b has a first notch 121c, and the second through hole 122b has a second notch 122c, so that the conductive element 12 may be directly clamped to the pin main body 131 of the fixing part 13 through the first notch 121c and the second notch 122c. Likewise, the metal spring 132 of the fixing part 13 presses the first junction 121, so that the first junction 121 electrically contacts with the surface of the heat dissipation element 11, and the bridge portion 123 provides an elastic force, so that the second junction 122 presses against and electrically contacts with the bare metal area 231.

Figure 3A:
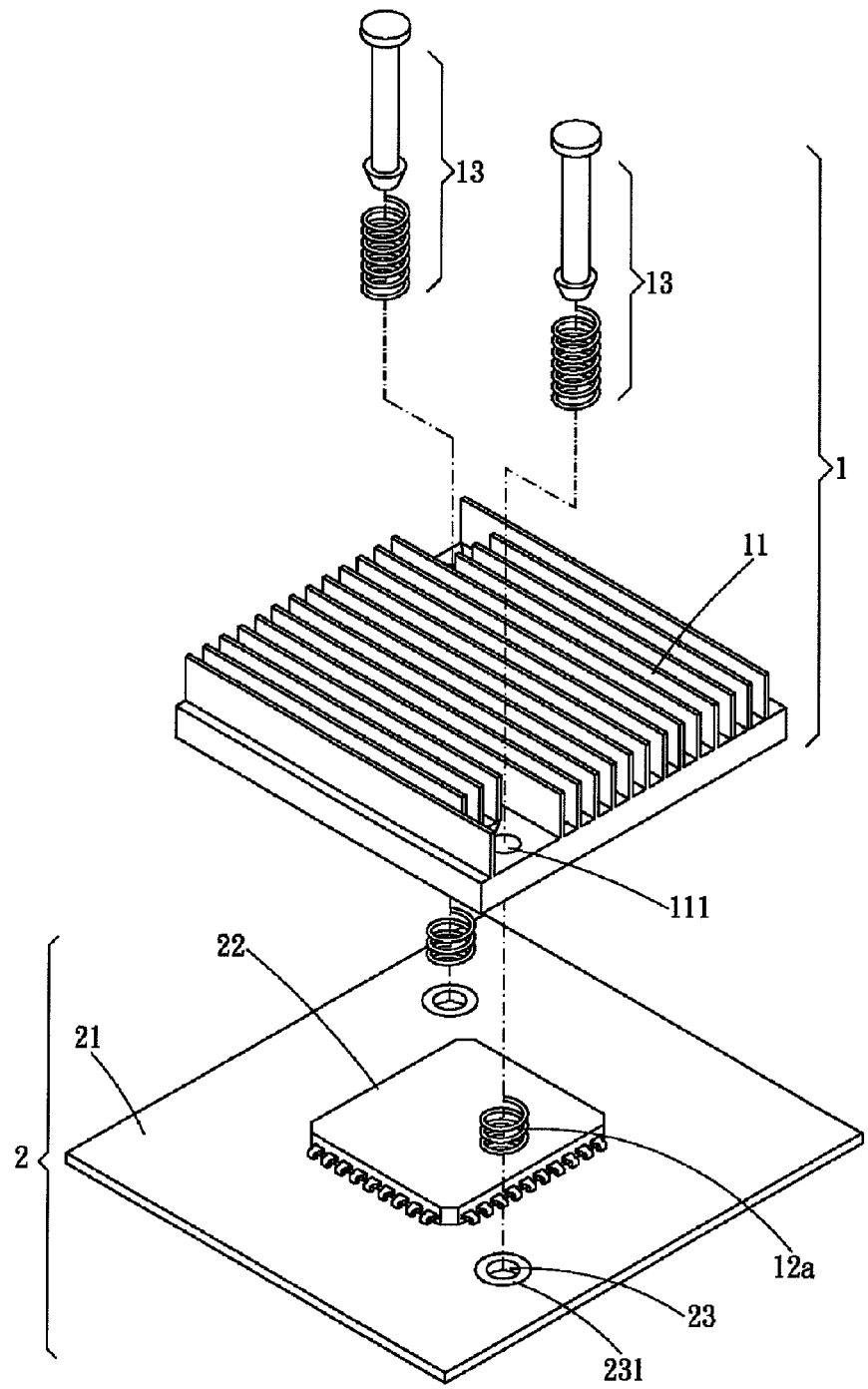
FIG. 3A is an explosive view of a second embodiment of the present invention.
Figure 3B:
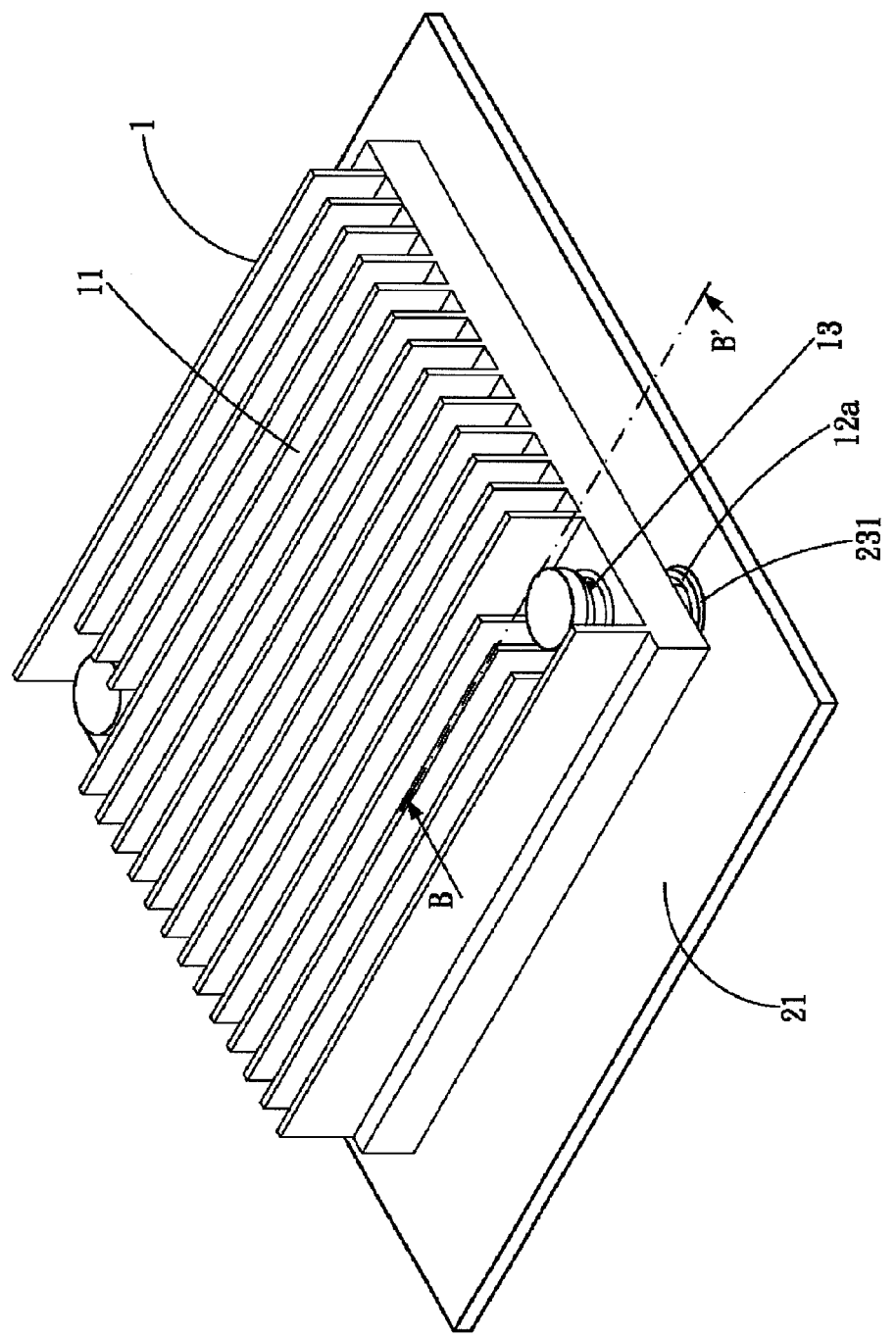
FIG. 3B is an assembly view of a second embodiment of the present invention.
Figure 3C:
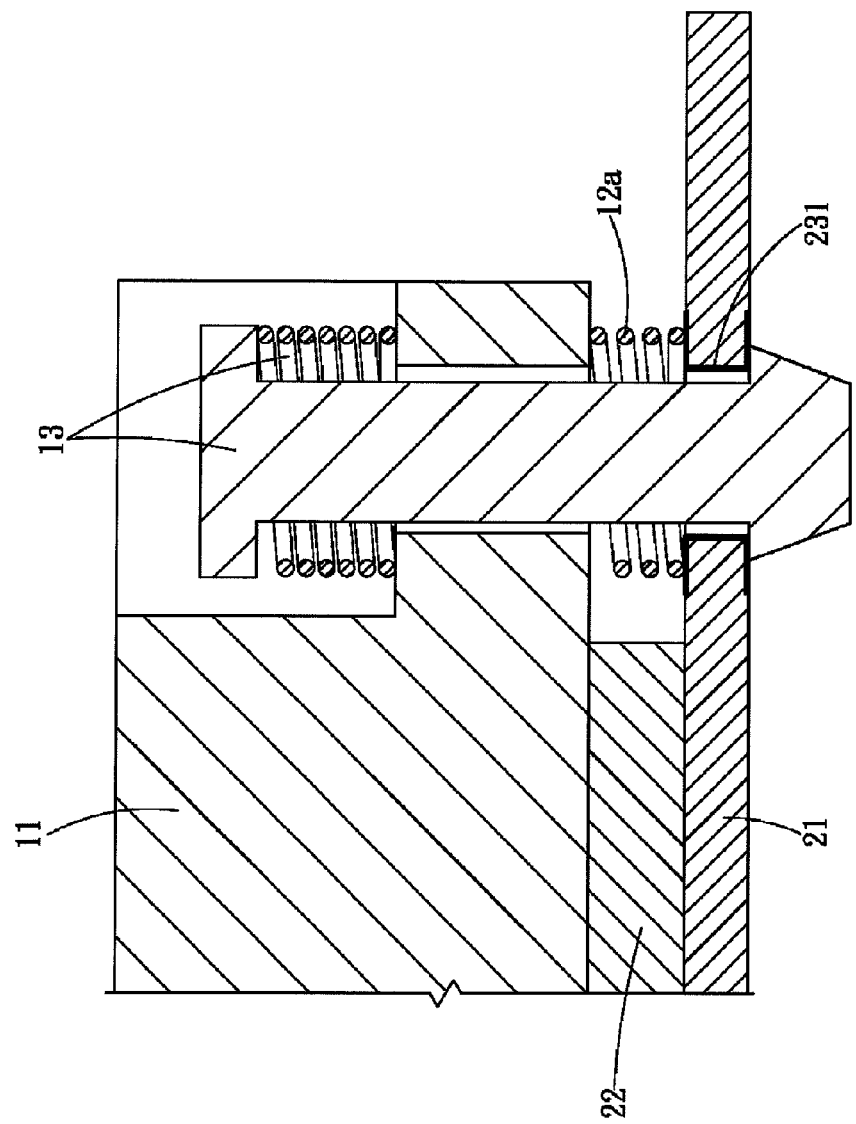
FIG. 3C is a sectional view along a section line BB' of FIG. 3B.

FIGS. 3A to 3C are respectively an explosive view of a second embodiment of the present invention, an assembly view of the second embodiment of the present invention, and a sectional view along a section line BB' of FIG. 3B. Please refer to FIGS. 3A to 3C, in which the main difference between this embodiment and the first embodiment lies in that, the conductive element is a spring 12a made of a conductive material. The spring 12a is disposed between the heat dissipation element 11 and the circuit board 2, with one end pressing against the bare metal area 231 of the circuit board 2 and the other end pressing against a surface of the heat dissipation element 11 facing the circuit board 2. The fixing part 13 passes through the fixing hole 111 and the spring 12a in sequence, and then is inserted into the positioning hole 23 of the circuit board 2, to fix the heat dissipation element 11 and the spring 12a to the circuit board 2. The fixing part 13 presses the heat dissipation element 11, to further compress a length of the spring 12a disposed between the heat dissipation element 11 and the circuit board 2, so that both ends of the spring 12a respectively press against the heat dissipation element 11 and the bare metal area 231 through an elastic force. In this embodiment, the heat dissipation element 11 is connected electrically to the bare metal area 231 of the circuit board 2 through the spring 12a; therefore, a noise coupled to the heat dissipation element 11 during high-speed computation of the chip 22 can also be eliminated through the grounding.

According to the foregoing embodiments, the present invention further provides a circuit board, including the substrate 21, the chip 22, the heat dissipation element 11, the fixing part 13 and the conductive element 12 in the foregoing embodiments. When a high-frequency noise generated by the chip of the circuit board is coupled to the heat dissipation element 11, the noise may be eliminated as the conductive element 12 is grounded, so that the high-frequency noise fails to cause electromagnetic interference to other electronic elements on the circuit board or other electronic devices around the circuit board by using the heat dissipation element 11 as an antenna.

While the present invention has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A heat dissipation device, used in a circuit board, wherein the circuit board comprises a chip and at least one positioning hole disposed around the chip, each of the at least one positioning hole has a bare metal area on a periphery of each of the at least one positioning hole, and the heat dissipation device comprises:
    a heat dissipation element, disposed on the chip and having at least one fixing hole;
    a conductive element comprises:
        a first junction connected electrically to the heat dissipation element, the first junction having a first through hole;
        a second junction connected electrically to the bare metal area of the circuit board, the second junction having a second through hole; and
        a bridge portion, two ends of the bridge portion are connected electrically to the first junction and the second junction respectively, and the bridge portion provides an elastic force, so that the second junction presses against the bare metal area of the circuit board; and
    at least one fixing part, each of the of the at least one fixing part passing sequentially through the first through hole, a respective one of the at least one fixing hole, and the second through hole to press the first junction to a surface of the heat dissipation element, and connected to a corresponding one of the at least one positioning hole, so as to fix the heat dissipation element to the circuit board.

2. The heat dissipation device according to claim 1, wherein the second junction has at least one second bulge, and the second junction is connected electrically to the bare metal area of the circuit board through the at least one second bulge.

3. The heat dissipation device according to claim 2, wherein the first junction has at least one first bulge, and the first junction is connected electrically to the heat dissipation element through the at least one first bulge.

4. The heat dissipation device according to claim 3, wherein the first through hole has a first notch, the second through hole has a second notch, and the conductive element is clamped to each of the at least one fixing part through the first notch and the second notch.

5. The heat dissipation device according to claim 1, wherein the bridge portion is connected to the second junction through an inclined plane, and when the second junction presses against the bare metal area of the circuit board, an angle is formed between the inclined plane and the circuit board.

6. The heat dissipation device according to claim 1, wherein the first junction, the bridge portion, and the second junction are integrally formed.

7. A circuit board, comprising,
    a substrate, having at least one positioning hole, wherein each of the at least one positioning hole has a bare metal area on a periphery of each of the at least one positioning hole;
    a chip, disposed on the substrate;
    a heat dissipation element, disposed on the chip and having at least one fixing hole;
    a conductive element comprises:
        a first junction connected electrically to the heat dissipation element, the first junction having a first through hole;
        a second junction connected electrically to the bare metal area of the substrate, the second junction having a second through hole; and
        a bridge portion, two ends of the bridge portion are connected electrically to the first junction and the second junction respectively, and the bridge portion provides an elastic force, so that the second junction presses against the bare metal area of the substrate; and
    at least one fixing part, each of the of the at least one fixing part passing sequentially through the first through hole, a respective one of the at least one fixing hole, and the second through hole to press the first junction to a surface of the heat dissipation element, and connected to a corresponding one of the at least one positioning hole, so as to fix the heat dissipation element to the substrate
    at least one fixing part, each of the of the at least one fixing part passing through a corresponding one of the at least one fixing hole and connected to a corresponding one of the at least one the positioning hole, so as to fix the heat dissipation element to the substrate.

8. The circuit board according to claim 7, wherein the second junction has at least one second bulge, and the second junction is connected electrically to the heat dissipation element through the at least one second bulge.

9. The circuit board according to claim 8, wherein the first junction has at least one first bulge, and the first junction is connected electrically to the bare metal area of the substrate through the at least one first bulge.

10. The circuit board according to claim 9, wherein the first through hole has a first notch, the second through hole has a second notch, and the conductive element is clamped to each of the at least one fixing part through the first notch and the second notch.

11. The circuit board according to claim 7, wherein the bridge portion is connected to the second junction through an inclined plane, and when the second junction presses against the bare metal area of the substrate, an angle is formed between the inclined plane and the substrate.

12. The circuit board according to claim 7, wherein the first junction, the bridge portion and the second junction are integrally formed.

* * * * *